United States Patent
Bennett et al.

[11] Patent Number: 6,117,690
[45] Date of Patent: Sep. 12, 2000

[54] METHOD OF MAKING THIN, HORIZONTAL-PLANE HALL SENSORS FOR READ-HEADS IN MAGNETIC RECORDING

[75] Inventors: James Bennett, Hightstown; Stuart A. Solin, Princeton Junction, both of N.J.; Richard A. Stradling, London, United Kingdom; Tineke Thio, Princeton, N.J.

[73] Assignee: NEC Research Institute, Inc., Princeton, N.J.

[21] Appl. No.: 09/241,124

[22] Filed: Feb. 1, 1999

Related U.S. Application Data

[62] Division of application No. 08/781,994, Jan. 6, 1997.

[51] Int. Cl.[7] .................................................. H01L 21/00
[52] U.S. Cl. ....................................... 438/3; 438/93
[58] Field of Search ................... 438/3, 48, 93, 438/102, 104

[56] References Cited

U.S. PATENT DOCUMENTS

| | | | |
|---|---|---|---|
| 3,763,407 | 10/1973 | Yazawa | 317/235 |
| 3,800,193 | 3/1974 | Ashar et al. | 317/235 R |
| 3,959,026 | 5/1976 | Marine et al. | 148/1.5 |
| 4,577,250 | 3/1986 | Sato et al. | 360/112 |
| 4,731,640 | 3/1988 | Bluzer | 357/30 |
| 5,075,247 | 12/1991 | Matthews | 438/3 |
| 5,089,991 | 2/1992 | Matthews | 365/9 |
| 5,093,753 | 3/1992 | Freiderich et al. | 360/112 |
| 5,144,603 | 9/1992 | Mozume et al. | 369/44.14 |
| 5,155,643 | 10/1992 | Jones, Jr. et al. | 360/113 |
| 5,166,849 | 11/1992 | Fedeli | 360/112 |
| 5,453,727 | 9/1995 | Shibasaki et al. | 338/32 R |
| 5,476,804 | 12/1995 | Lazzari | 438/3 |
| 5,521,500 | 5/1996 | Schuhl et al. | 324/249 |
| 5,646,051 | 7/1997 | Solin | 438/3 |
| 5,652,445 | 7/1997 | Johnson | 257/295 |
| 5,657,189 | 8/1997 | Sandhu | 360/112 |
| 5,668,395 | 9/1997 | Razeghi | 257/441 |
| 5,696,655 | 12/1997 | Kawano et al. | 360/326 |

OTHER PUBLICATIONS

J.R. Childress et al. "New epitaxial multilayer system for spin–valve magnetic sensors", Appl. Phys. Lett., vol. 63, No. 14, pp. 1996–1998, Oct. 4, 1993.

R.S. Indeck et al. "A Magnetoresistive Gradiometer", IEEE Transactions on Magnetics, vol. 24, No. 6, pp. 2617–2619, Nov. 1988.

P.J. Restle et al. "Non–Gaussian effects in 1/f noise in small silicon–on–sapphire resistors", Physical Review B, vol. 31, No. 4, pp. 2254–2262, Feb. 15, 1985.

*Primary Examiner*—Chandra Chaudhari
*Attorney, Agent, or Firm*—Philip J. Feig

[57] ABSTRACT

Thin, horizontal-plane Hall sensors for read-head in magnetic recordings and methods for fabricating the sensor provide a novel sensor exhibiting high sensitivity and high spatial resolution.

17 Claims, 4 Drawing Sheets

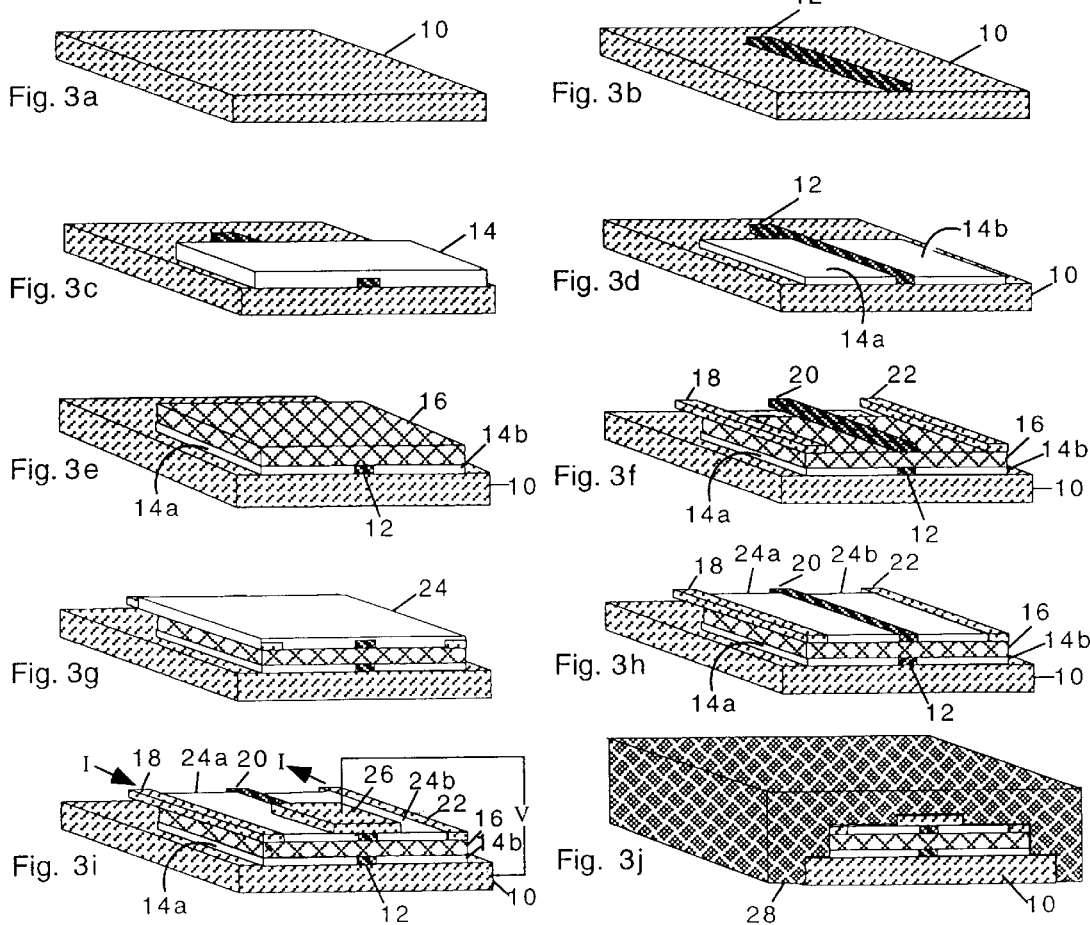

METHOD OF MAKING THIN, HORIZONTAL-PLANE HALL SENSORS FOR READ-HEADS IN MAGNETIC RECORDING

This is a divisional of application Ser. No. 08/781,994, filed Jan. 6, 1997.

FIELD OF THE INVENTION

The present invention relates to Hall-bar read-head sensors. Specifically, the invention refers to fabrication methods and material selection resulting in a Hall-bar read-head sensor exhibiting high sensitivity and high spatial resolution.

BACKGROUND OF THE INVENTION

To date there have been numerous proposals for the design of read-head sensors in high density magnetic recording. The proposals are included in U.S. Pat. No. 5,155,643 by R. E. Jones Jr. et al., issued Oct. 13, 1992, entitled "Unshielded Horizontal Magnetoresistive Head and Method of Fabricating Same"; pending U.S. patent application Ser. No. 08/688,583 entitled "A Self-Biasing, Non-Magnetic, Giant Magnetoresistance Sensor"; pending U.S. patent application Ser. No. 08/435,254, entitled "Process for Forming a Magnetoresistive Sensor for a Reading Head"; an article by J. R. Childress et al. entitled "New Epitaxial Multilayer System for Spin-Valve Magnetic Sensors" in Applied Physics Letters, Vol. 63, 1996 (1993); U.S. Pat. No. 5,166,849, by J. M. Fedeli, issued Nov. 24, 1992, entitled "Horizontal Magnetic Head With Hall Effect and its Embodiment Methods"; and an article by R. S. Indeck et al, entitled "A Magnetoresistive Gradiometer" in IEEE Trans. Mag., Vol. 24, 2617 (1988). The latter four proposals all involve the use of detection elements which lack vertical spatial resolution in the direction normal to the plane of the magnetic track. But the strength of the magnetic field constituting the signal falls off extremely rapidly with distance above the surface of the recording medium. Therefore, higher sensitivity is achievable by selectively sampling the signal field only in the region very close to the surface of the recording medium. In practice this requires not only a very small flying height less than 1000 Å but also a "thin" detector with a thickness in the vertical direction of less than 500 Å. A further advantage of a thin detector is that it needs no shielding since it senses only the local field at the surface of the recording medium as described in the first three proposals above.

Modem read-head sensors can be classified into two major categories, direct sensing and remote sensing. Either the media field is sensed directly by the detector element or the field variations from the medium are communicated to a remote magnetic transducer through a gapped high-permeability magnetic circuit. In both cases the transducers themselves can be of the giant magnetoresistance (GMR) or Hall-effect type, can be elements of an integrated circuit which provides signal amplification as described in U.S. Pat. Nos. 3,800,193 and 5,521,500 as well as write head elements as described in U.S. Pat. No. 5,155,643, and can be paired to provide differential detection as described in Indeck et al. However, to increase the vertical resolution of a remote sensor sensitivity must be sacrificed; therefore, the present invention refers to direct sensors which are inherently the most sensitive.

Two unshielded thin detector read-head designs have been proposed to date in U.S. Pat. No. 5,155,643 (Jones et al.) and in the pending U.S. patent application Ser. Nos. 08/435,254 and 08/688,583. Jones et al. employ a pair of rectangular metallic GMR differential transducers oriented with their planes parallel to the medium surface and separated by an insulating gap which defines the lateral (along the recording track) resolution of the assembly. But modem cost effective state-of-the-art optical lithographic techniques limit the size of the gap and therefore the lateral resolution to at best 2500 Å while lateral resolutions of 500 Å or more (e.g. smaller gaps) will be required for future high density recording in excess of 20 Gb/in$^2$. The other unshielded thin detector which was proposed in the pending patent applications employs a semiconductor GMR sensor in a Corbino rectangle horizontal-plane geometry. This thin sensor (less than 300 Å high) offers very high lateral resolutions of 500 Å. However, owing to the physical limitations of modem materials it has a very large GMR but relatively low output voltage, even when sensing fields of the order of 500G close to the recording medium surface. The present invention proposes an alternative, high lateral resolution thin Hall-bar sensor which has at least a factor of 8 higher signal output than the Corbino sensor of the same material at H=500G. The invention also concerns an inexpensive method for commercial production of the thin sensor. This production method is based in-part on concepts previously outlined for the fabrication of horizontal-plane Corbino detectors in the pending patent applications.

SUMMARY OF THE INVENTION

A principal object of the present invention is therefore, the provision of a high lateral resolution thin, horizontal-plane Hall-bar sensor.

Another object of the invention is the provision of a method of producing such a thin Hall-bar sensor.

A further object of the invention is the provision of specific non-magnetic semiconductor sensor material to be used in such a thin Hall-bar sensor.

Further and still other objects of the present invention will become more clearly apparent when the following description is read in conjunction with the accompanying drawing.

BRIEF DESCRIPTION OF THE DRAWING

FIGS. 3a–3j are schematic representations of a preferred sequence of deposition steps used for the preparation of thin Hall-bar detectors;

FIG. 4b shows one section of the structure shown in FIG. 4a.

DETAILED DESCRIPTION

It has been shown that narrow-gap (NG) semiconductors are viable materials for use as magnetic sensors in read-heads. The basis for this observation is the room-temperature GMR which these materials exhibit when employed in a horizontal-plane Corbino geometry. Among the family of NG semiconductors, the zero-gap II-VI compound $Hg_{1-x}Cd_xTe$, x~0.1, was found to be especially promising and thin films of that material produced by molecular beam epitaxy (MBE) techniques have already yielded the highest room temperature, low field thin film GMR reported to date, 28% at 500 Gauss. [GMR values as high as 120% at 500 Gauss in bulk material of similar compositions has been reported.] Some III-V compounds such as $InSh_{1-x}As_x$ also hold promise as GMR detectors. The same physical properties which make NG semiconductors competitive materials for use as GMR read-heads also make them viable as thin Hall sensor read-heads. Furthermore, if the magnetic field to be detected is below a crossover field, $H_x$, the Hall-bar detector yields an output signal that is larger than that which is obtainable with a thin GMR Corbino detector.

Figure 1:
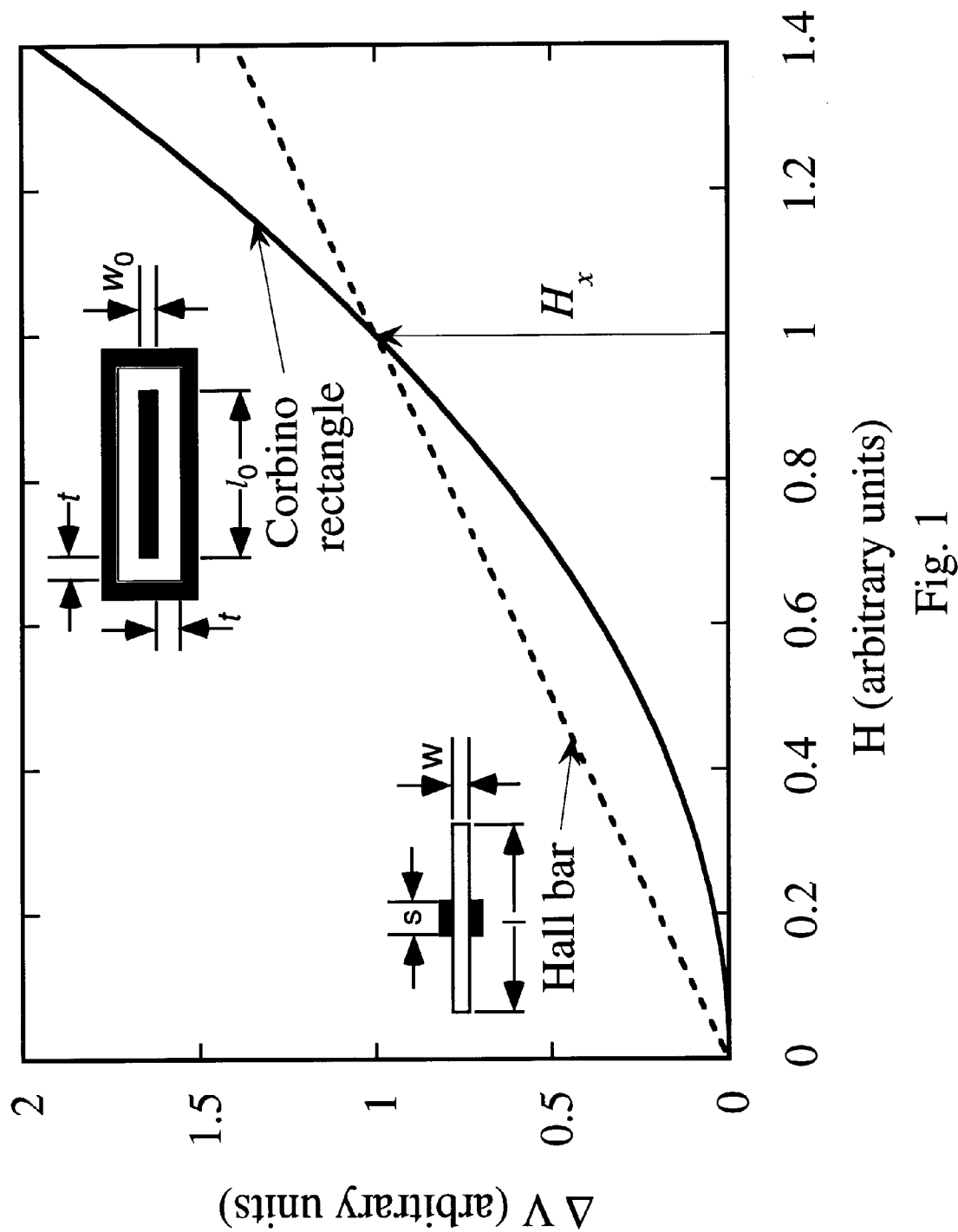
FIG. 1 is a graphical representation of the field dependence of the differential voltage for a Hall-bar and Corbino rectangle detector.

In the Appendix it is shown that the field dependence of the output voltage of a Corbino detector is $$V_{Cor} = C_{Cor} A_{Cor} \bar{J}_c \rho \{1 + (\mu H)^2\} \tag{1}$$

where $\bar{J}_c$ is the average current density over an arbitrary surface between the inner and outer electrodes, $A_{Cor}$ is the area of that surface, $C_{Cor}$ is the Corbino geometric factor, $\rho$ is the resistivity of the sensor material, and $\mu$ is its mobility. It is assumed that at the low fields produced by recording media both $\rho$ and $\mu$ are field independent. The change in Corbino voltage associated with a change in field from 0 to H Gauss is $\Delta V_{Cor} = C_{Cor} A_{Cor} \bar{J}_c \rho (\mu H)^2$. The Hall voltage developed in a rectangular parallelepiped Hall-bar detector with a large (>5) length to width ratio as shown in the bottom left-hand inset of FIG. 1 will be $$V_{Hall} = C_{Hall} A_{Hall} \bar{J}_H \rho (\mu H) \tag{2}$$

where $\bar{J}_H$ is the (uniform) current density along the Hall-bar, $A_{Hall}$ is its cross-sectional area normal to the current flow and $C_{Hall}$ is the Hall geometric factor. In FIG. 1 the dashed line is the graph for a Hall-bar detector (shown in the lower left of the figure) and the solid line is the graph for a Corbino rectangle detector (shown in the upper right of the figure). The change in Hall voltage associated with a change in field from 0 to H gauss is $\Delta V_{Hal} = C_{Hall} A_{Hall} \bar{J}_H \rho (\mu H)$. The crossover field is defined by the condition $\Delta V_{Hall}(H_x) = \Delta V_{Cor}(H_x)$ which, if equal current densities ($\bar{J}_H = \bar{J}_C$) are assumed, yields $$H_x = \frac{1}{\mu} \frac{C_{Hall} A_{Hall}}{C_{Cor} A_{Cor}}. \tag{3}$$

FIG. 1 shows schematically the differential Hall and Corbino voltages and the crossover field. Notice that if $\mu H_x < (C_{Hall} A_{Hall})/(C_{Cor} A_{Cor})$, $V_{Hall} > V_{Cor}$. Therefore, for sensing fields well below the crossover field, the Hall-bar geometry is more effective.

As can be seen from FIG. 1 and Equations 1 to 3, the choice of a particular detector geometry depends on the shape and dimensions of the detector and on the mobility of the dominant carriers in the sensing material. Consider first the Hall/Corbino ratio $(C_{Hall} A_{Hall})/(C_{Cor} A_{Cor})$. For a long and narrow rectangular parallelepiped Hall-bar carrying current along its length $C_{Hall} A_{Hall} = (1/h)(wh) = w$, where w is its width, independent of its length, l, and thickness, h. For a Corbino disk of the same thickness h with inner (outer) electrode radius $r_a(r_b)$, $C_{Cor} A_{Cor} = \{[1/(2\pi h)] \ln(r_b/r_a)\}(2\pi rh)$ evaluated at a radius, r. However a disk geometry is impractical for read-head applications which require a rectangular Corbino structure such as that depicted in the top right hand inset of FIG. 1. Since the average current density in such a structure will be maximal on the surface of the inner electrode, we chose that surface to evaluate the product $C_{Cor} A_{Cor}$ and find (see the Appendix) that $C_{Cor} A_{Cor} \times (l_0 + w_0)/2\{[\ln(1+2t/l_0)]^{-1} + [\ln(1+2t/w_0)]^{-1}\}$ in which case the Hall/Corbino ratio is $$\frac{C_{Hall} A_{Hall}}{C_{Cor} A_{Cor}} = \left[\frac{2w}{l_0 + w_0}\right] \{[\ln(1+2t/l_0)]^{-1} + [\ln(1+2t/w_0)]^{-1}\}. \tag{4}$$

Before considering the implications of this result the mobility term in Equation 3 must be considered. Narrow-gap semiconductors such as InSb and $Hg_{1-x}Cd_xTe$, x~0.1, exhibit very high mobility because the mobility varies inversely with the effective mass which itself is proportional to the gap. Such semiconductors can have room temperature bulk mobilities in the range of 50,000 to 70,000 $cm^2Vsec$. Taking the higher of these figures yields a value of 1429 Gauss for the first factor in Equation 3. Addressing now the second factor, it should be noted that modern recording disks have track widths of the order of 1 $\mu$m and tangential bit spacings of approximately 1000 Å. Assuming the corresponding Corbino rectangle dimensions of $l_0$=9000 Å, $w_0$=200 Å, t=300Å, (see top right hand inset of FIG. 1) applying Equations 3 and 4 the result is that $H_x$=5036 Gauss. The maximal field change one can access with the horizontal-plane geometry and modern disk media is less than approximately 500 Gauss while the accessible field with a vertical plane geometry is typically 50 Gauss on average. At these fields the differential Hall voltage exceeds the differential Corbino voltage by factors of approximately 8 and 80, respectively. Thus the Hall-bar geometry is clearly superior to the rectangular Corbino geometry for NG semiconductor read-heads, barring other considerations.

Figure 2:
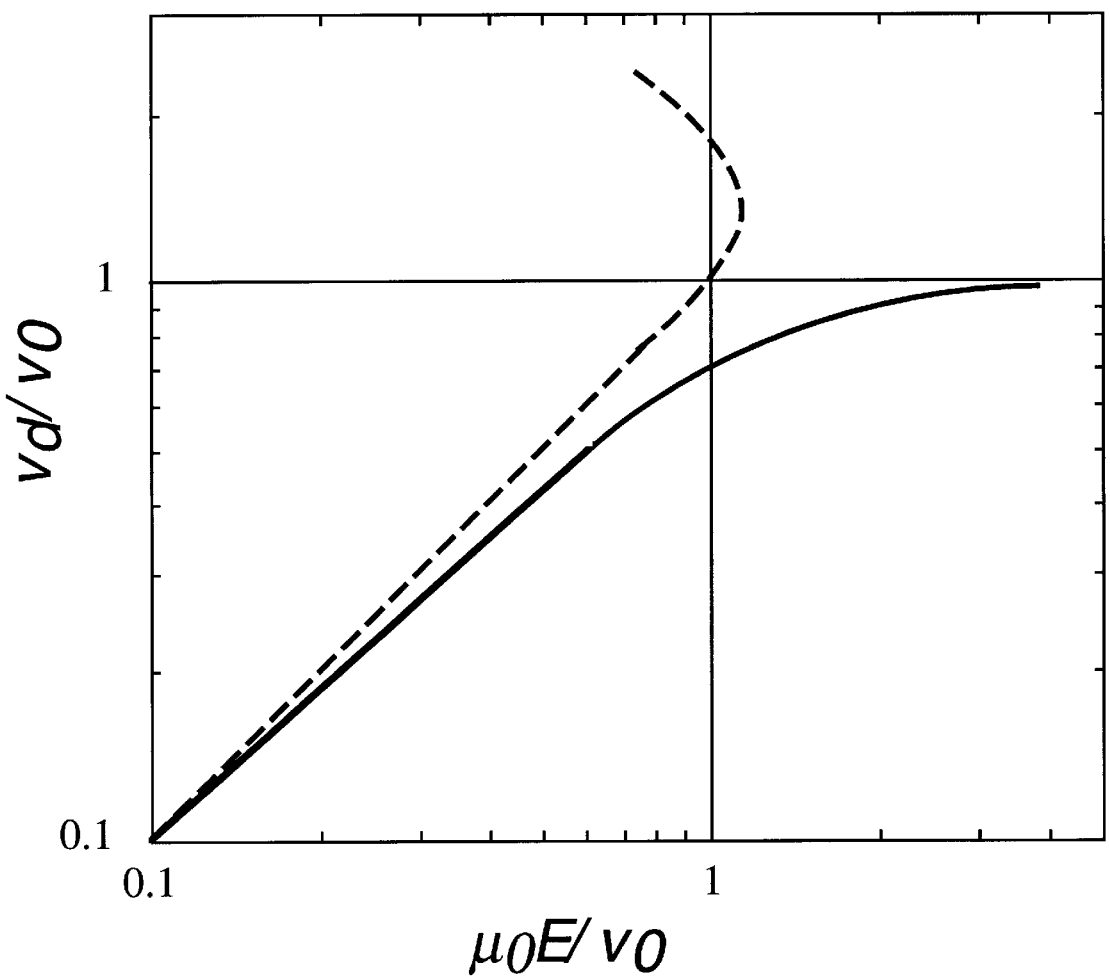
FIG. 2 is a graphical representation of the normalized drift velocity ($V_d/V_o$) versus normalized electric field ($\mu_o E/V_o$) for non-polar (solid line) and polar (dashed line) semiconductors.
Figure 4A:
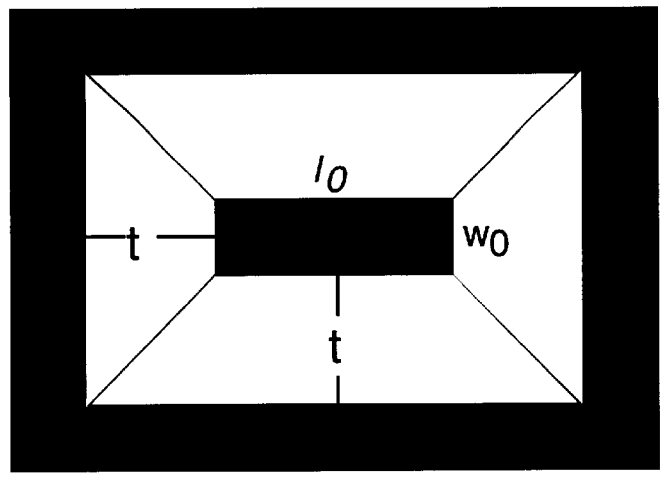
FIG. 4a shows a rectangular Corbino structure.
Figure 4B:
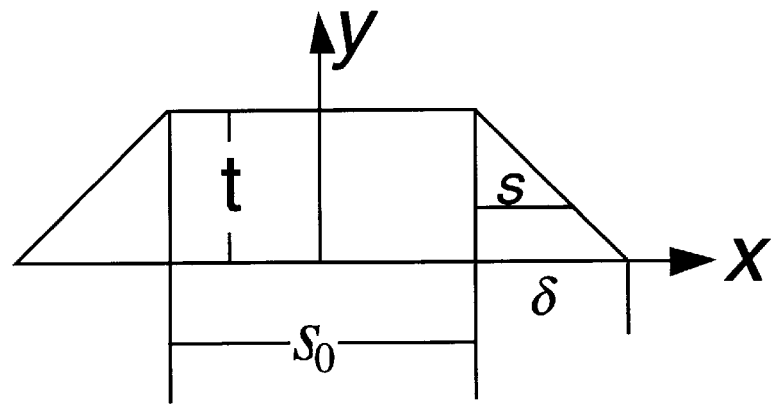

Materials for a Hall-bar read-head and an estimate of the unamplified output voltage one can reasonably expect to obtain using such materials will now be considered. The Hall voltage given in Equation 2 can be usefully rewritten as $$V_{Hall} + Ew(\mu H) = v_d wH \tag{5}$$

where $E = \bar{J}_H \rho$ is the electric field in the read-head material between the applied voltage leads and $v_d = \mu E$ is the drift velocity. For both non-polar semiconductors such as Si and Ge, and polar semiconductors such as GaAs and InSb it is convenient to define a drift velocity $$v_0 = \left(\frac{3 k_B \Theta}{4 m^{*c} \coth(\Theta/2T)}\right)^{1/2} \tag{6}$$

where kB is Boltzman's constant, $\Theta$ is the optical phonon Debye temperature which is obtained from the maximum phonon energy, $m^{*c}$ is the low-field conduction effective mass and T is the lattice temperature. A plot of the normalized drift velocity $v_d/v_0$ versus the normalized electric field, $\mu_0 E/v_0$, where $\mu_0$ is the zero-electric-field mobility, is shown for both non-polar and polar semiconductors in FIG. 2 for T >$\Theta$. For the former, the maximum (or saturation) drift velocity $v_d^{max} = v_0$ is indicated by the solid line in FIG. 2. For the latter, the maximum drift velocity is $v_d^{max} \sim 1.2 v_0$ is indicated by the dashed line in FIG. 2. In either case it is evident from Equations 5 and 6 that materials with very small effective mass, such as NG semiconductors, will have the highest sensitivity as thin Hall-bar sensors.

In Table 1 is a list of the Debye temperature, the conduction effective mass for electrons, the maximum drift velocity, the corresponding maximum fields $E^{max} = 1.2 v_0/\mu_0$ (polar materials) and $E^{max} = v_0/\mu_0$ (non-polar materials), the maximum Hall voltage for a thin Hall-bar detector of height, width and length 300 Å×1000 Å×1 $\mu$m in a 500 Gauss field and the bulk room temperature zero-field mobility for some important non-polar and polar semiconductors. Thus, for a signal field of 500 Gauss, the estimated Hall voltages for thin polar semiconductor detectors deduced from the data of Table I and Equations 5 and 6 are of order 5 to 10 mV. This is equivalent to the output voltages of spin valve read-heads of length $3 \mu m$. However, to read disks with densities of 100 Gb/in$^2$ (the maximum density, limited by the physical properties of current media), a much shorter read-head, approximately 0.1 $\mu m$, will be required. This will result in a proportional (30-fold) drop in output voltage for GMR detectors while the output of the Hall-bar depends only on its width, which will require at most a 2-fold reduction to 500 Å.

TABLE 1

| Material | $\Theta$ (°K) | $m_e^{*c}$ ($m_0$) | $v_d^{max}$ (10$^7$ cm/sec) | $V_{Hall}^{max}$ (mV) | $\mu_{On}$ (cm$^2$/Vs) | $E^{max}$ V/cm |
|---|---|---|---|---|---|---|
| InSb | 200 | 0.0145 | 7.10 | 5.4 | 90,000 | 9,468 |
| InAs | 357 | 0.023 | 9.71 | 7.4 | 33,000 | 3,530 |
| GaAs | 417 | 0.067 | 6.74 | 5.1 | 9,000 | 8,987 |
| Hg$_{0.9}$Cd$_{0.1}$Te | 224 | 0.016 | 7.53 | 5.7 12.8 | 30,000 | 3,012 |
| C(diamond) | 1998 | 0.48 | 3.48 | 1.7 | 1,800 | 58,000 |
| Si | 788 | 0.26 | 2.70 | 1.4 | 1,500 | 54,000 |
| Ge | 454 | 0.12 | 2.43 | 1.2 | 3,900 | 19,185 |

It should be emphasized that the results shown in Table 1 are estimates only. While the general inference that semiconductors with a small $m_e^{*c}$ provide the highest Hall voltage is clearly warranted, one should consider the polar materials listed as roughly equivalent [but superior to the non-polar materials] and other more subtle criteria will dictate the optimum choice of material. For instance, bulk $Hg_{1-x}Cd_xTe$, $x\sim0.1$ exhibits an anomalously high room-temperature effective $\mu H$ product which is a factor of $\sqrt{5}$ to $\sqrt{10}$ higher than one would obtain from the measured mobility and field. This results in a 5 to 10-fold increase in the Corbino voltage and a $\sqrt{5}$ to $\sqrt{10}$-fold increase in the Hall voltage. Thus, if thin film $Hg_{1-x}Cd_xTe$, $x\sim0.1$, with the same properties can be reliably prepared, its effective maximum Hall voltage may be greater than 12.8 mV as indicated by the dual entry for this material in Table I. It is also important to note that the room temperature intrinsic carrier concentrations of the materials listed in Table I will be less than $10^{18}$ cm$^{-3}$. Therefore, the increase in zero-field conduction effective mass due to the Burstein-Moss effect will be small and in any case might be mitigated by compensation doping.

A number of other properties might influence the choice of material for thin Hall-bar read-heads. Thermal stability in the output voltage is an important factor in such a choice because unavoidable read-head crashes cause local heating of the head material which increases noise. It has already been shown that the thermal stability of $Hg_{1-x}Cd_xTe$, $x\sim0.1$ is comparable to that of the best spin-valve magnetic detectors and that selective doping can increase that stability further. Hardness and chemical stability are also important properties of head materials. The former may be addressed by encasing the head element in a diamond film coating (assuming it is not made from diamond itself). In which case the adhesion of such films to a particular head material would be important.

One must assess the applied voltage, power dissipation and noise properties for maximum Hall output. Consider again a thin polar semiconductor Hall-bar with dimensions l=1 $\mu m$, w=1000 Å, h=300 Å, a room temperature carrier density (either intrinsic or doped) of n=$10^{17}$ cm$^{-3}$, a mobility of 30,000 cm$^2$/Vsec, a maximum field of 3000 V/cm and an applied magnetic field of 500 Gauss. When the device is operated at the maximum drift velocity, the resistivity is $\rho=E^{max}/J_H^{max}=(1.2v_0/\mu_0)/nev_0=2.4\times10^{-2}\Omega cm$. The applied voltage is $V_{app}=E_{max}l=0.3V$ while the power dissipation is $P=(E^{max2}/\rho)lwh=1.13\mu W$.

The latter should pose no problem á vis a vis self heating since the dissipation of heat from the Hall-bar will be proportional to the surface-to-volume ratio which is of the same order as that for conventional thin metal film detectors which dissipate 1000 times the power. The low power dissipation may also be advantageous for read-heads used in battery powered applications.

Turning now to the noise issue, note that high frequency thermal fluctuations are the primary sensor noise source. In that case the power signal to noise ratio for the thin Hall-bar is given by the following expression $$(SNR)^{Hall}_{power} = 0.13 \frac{(\mu_0 H)^2 (E^{max2}/\rho)}{w/s} \frac{lwh}{k_B T \Delta f} = \beta^{Hall}_{power} \frac{V}{k_B T \Delta f} \quad (7)$$

where $\Delta f$ is the frequency bandwidth, V=lwh is the detector volume, and s is the width of the Hall contacts (see left hand inset of FIG. 1) which we assume to be 2500 Å, the limit for optical lithography. We define the parameter $\beta^{Hall}_{power}$ be the effective signal to noise ratio figure of merit. For a thin Hall-bar with the conservative properties noted above, $\beta^{Hall}_{power}=2.74\times10^6 W/cm^3$ and for $\Delta f=1 Hz$ and T=300K, $(SNR)^{Hall}_{power}=2\times10^{12}$. By way of comparison, the power signal to noise ratio for a magnetoresistive detector is $$(SNR)^{MR}_{power} = 0.016(\Delta\rho/\rho)^2(J^2\rho)\frac{lwh}{k_B T \Delta f} = \beta^{MR}_{power} \frac{V}{k_B T \Delta f} \quad (8)$$

For metallic spin-valve MR detector with J=$10^7$ Amp/cm$^2$, $\rho=4\times10^{-5}\Omega cm$ and $\Delta\rho/\rho=0.15$ we find $\beta^{MR}_{power}=1.4\times10^6 W/cm^3$. Presently, spin valves have typical dimensions of l=1 $\mu m$, w=200 Å, h=$\mu m$ which, for $\Delta f=1$ Hz and T=300K yields $(SNR)^{MR}_{power}=6.9\times10^{12}$. This is of the same order but somewhat larger (due to the larger detector volume) than the conservatively estimated value for the thin Hall-bar. These signal to noise ratios are currently larger than those associated with other noise sources such as media noise, head height fluctuations, etc. However, as technological advances reduce the noise from these other sources, sensor noise may become the paramount factor limiting recording density.

The difficulty of fabricating a commercially practical thin Hall-bar read-head sensor, which requires a four-contact configuration, may be a significant barrier to its use. A description of a preferred method for fabricating a horizontal-plane thin Hall-bar read-head sensor will now be described. Despite the fact that optical lithographic techniques alone are required for the fabrication process and no e-beam methods need be employed, the resultant detector can have a longitudinal (along the recording track) resolution of 500 Å, a radial (track to track) resolution of 0.25 $\mu m$ and a vertical resolution (perpendicular to the plane of the track) of 300 Å.

FIG. 3a–3j shows schematically the deposition steps to be employed in a preferred fabrication method involving common deposition methods such as molecular beam epitaxy (MBE) or liquid phase epitaxy (LPE). A conducting semiconductor substrate 10 supports a read-head as shown in FIG. 3a. A narrow strip of an insulating material 12 is deposited on the substrate as shown in FIG. 3b. Next a wider but thinner strip of a second/different insulating material 14 is grown over the substrate 10 and strip of insulating material 12 as shown in FIG. 3c. This layer is selected for optimal lattice matching to the next layer to be grown. The top part of the insulating layer 14 is removed by ion etching or an equivalent process forming two layer sections 14a and 14b on each side of strip 12 so that the top surface of the narrow insulating material strip 12 is exposed as shown in FIG. 3d. A layer of the NG semiconductor hall-bar material 16 is then applied over the insulating layers 14a and 14b and strip of insulating material 12 as shown in FIG. 3e. Ideally this layer is grown epitaxially on the exposed surfaces of the insulating layers 14a and 14b and the narrow insulating strip 12. Next a triad of strips 18, 20, 22, the outer two of which are conducting 18, 22 and the middle one of which is insulating 20 is fabricated upon material 16 as shown in FIG. 3f. Again, these should be lattice matched as closely as possible to the underlying layer 16 for optimal epitaxial growth. A second layer of insulating material 24, identical to that applied in FIG. 3c (layer 14), is applied as shown in FIG. 3g and etched back to expose the strips 18, 20 and 22, thereby forming sections 24a and 24b as shown in FIG. 3h. At this point, the assembly represents a Hall-bar with the input current and the output voltage contacts as indicated in FIG. 3i. The assembly shown in FIG. 3i is overcoated with an insulating oxide 28 as shown in FIG. 3j after which the edge of the substrate is cleaved to reveal the bottom surface of the Hall-bar detector.

The final and critical step in the fabrication process is to produce a thin conducting path between the Hall material 16 and the voltage contacts 10 and 26. Preferably, this can be accomplished using one of two methods. In a diffusion method which has been previously described for the preparation of thin Corbino GMR detectors in the above pending patent applications and in an article by P. J. Restle et al entitled "Non-Gaussian Effects in 1/f noise in Small Silicon-on-Sapphire Resistors" in Phys. Rev. B31, No. 4, 2254 (1985), the assembly shown in FIG. 3j is exposed to the vapor of an element that will, if held at the correct temperature for the proper time, readily diffuse into the exposed edges of the insulating voltage strips but either will not penetrate any of the other exposed materials present in the assembly shown in FIG. 3j or will not alter their desired properties as it does penetrate the materials. Established methods such as those described in Restle et al., can be employed to control the diffusion process so that a shallow depth, less than approximately 300 Å, of both voltage strips 12, 20 are doped to be metallic/conducting thereby providing electrical continuity to the previously deposited conducting substrate 10 and top conducting layer 26 with which they are in intimate contact. The resultant "metallic" strips then function as Hall voltage contacts with an effective vertical resolution of less than approximately 300 Å.

A number of possible materials combinations may be used in the fabrication process described above. For example, if the NG semiconductor hall-bar material 16 is InAs, the substrates, current lead strips 18, 22 and top voltage lead 26 (see FIG. 3i) are preferably conducting GaAs, the voltage strips 12, 20 are preferably insulating GaAs and the insulators 14 and 24 deposited in steps 3c and 3g are preferably AlAs. The diffusant atom could then be Se which diffuses much more rapidly into GaAs than into the other materials. With mercury cadmium telluride as the Hall-bar material 16, the substrate 10 is preferably conducting InSb. The current lead strips 18, 22 and top voltage lead 26 are preferably Au. Alternatively, the voltage strips 12, 20 and the Hall-bar material 16 could be insulating CdTe and then the insulators 14, 24 deposited in steps 3c and 3g are preferably MgTe. The diffusant atom could then be Hg which under the proper conditions will diffuse to a shallow depth into the CdTe forming a thin $Hg_{1-x}Cd_xTe$ Hall-bar of the desired composition while not affecting the insulating properties of the MgTe which has a much larger band gap. In this latter case the Hall-bar and attached voltage strips are one contiguous entity of the same material. To facilitate manufacturing, large quantities of the structures shown in FIG. 2e could be batch processed in the diffusion step. If the Hall-bar material itself is InAs, a 2-dimensional electron gas will form at its surface upon cleaving, creating a thin Hall-bar without the need of a post-cleave diffusion step.

An alternative preferred method for providing a thin conducting path between the Hall-bar material 16 and voltage contacts 10, 26 applicable when the Hall-bar material is not InAs will now be described. The voltage strips 12, 20 deposited in the steps shown in FIGS. 3b and 3f preferably would be InAs. Upon cleaving, the front surface of this material will form an accumulation layer of excess electron charge that constitutes a 2-dimensional electron gas, the thickness of which is of order 300 Å. The conducting surface layer completes the conduction path for the Hall voltage probes. This new method has the distinct advantage of avoiding the post cleaving diffusion step with its attendant constraints on materials selection. Moreover, it ensures that the vital contacts for the voltage probe will be viable even after successive cleaving of the read-head surface.

Following the completion of the voltage probe conducting link using either of the two methods described above, it may be necessary to deposit a final overlayer on the exposed edge surface to passivate it or otherwise protect it from environmental degradation. The final assembly, with leads attached will ultimately be mounted to a fly head so that the exposed face shown in FIG. 3j is parallel and close to (less than 1000 angstroms) the recording disk surface. This can be achieved by active vertical positioning of the read-head relative to the fly-head with an appropriate piezoelectric transducer.

While there has been described and illustrated preferred embodiments, materials and fabrication methods for thin, horizontal-plane Hall sensors for read-heads in magnetic recordings, it will be apparent to those skilled in the art that further modifications and variations are possible without deviating from the broad teachings and spirit of the present invention which shall be limited solely by the scope of the claims appended hereto.

What is claimed is:

1. A method of fabricating a thin Hall-bar read-head sensor comprising the following steps:

providing a semiconductor substrate having an upper surface;

depositing a narrow strip of a first insulating material on the upper surface of said substrate;

growing a thin strip of a second insulating material over said narrow strip and said substrate;

exposing said narrow strip by removing said thin strip until it has a thickness substantially equal to the thickness of said narrow strip thereby also forming two sections of said thin strip;

applying a layer of Hall-bar material over said narrow strip and two sections of said thin strip;

fabricating three substantially parallel strips of material on said Hall-bar material, the two outer strips being conducting materials and the centrally disposed strip being insulating material;

growing a thin layer of said second insulating material over said layer of Hall-bar material and said three strips of material;

exposing said three strips by removing said thin layer until it has a thickness substantially equal to the thickness of said three strips, thereby forming two regions of second insulating material located between a respective outer conducting strip and said centrally disposed insulating strip;

fabricating a top conducting layer on said centrally disposed insulating strip and said two regions of second insulating material;

overcoating the assembly with an insulating material, and cleaving an edge of said substrate to reveal a bottom surface of the Hall-bar sensor, where said two outer conducting strips conduct input current and an output voltage is manifest between said top conducting layer and said substrate.

2. A method of fabricating a thin Hall-bar read-head sensor as set forth in claim 1, where said second insulating layer material is selected for optimal lattice match with said Hall-bar material layer.

3. A method of fabricating a thin Hall-bar read-head sensor as set forth in claim 1, where said applying is growing epitaxially.

4. A method of fabricating a thin Hall-bar read-head sensor as set forth in claim 1, where said Hall-bar material is a NG semiconductor.

5. A method of fabricating a thin Hall-bar read-head sensor as set forth in claim 1, where said Hall-bar material is InAs.

6. A method of fabricating a thin Hall-bar read-head sensor as set forth in claim 5, where said substrate, said two outer strips and said top conducting layer are conducting GaAs, said narrow strip and said centrally disposed strip are insulating GaAs and said second insulating material is AlAs.

7. A method of fabricating a thin Hall-bar read-head sensor as set forth in claim 6, where said fabricating of a top conducting layer is done by diffusion of a vapor into exposed edges of said materials, and the diffusant atom is Se.

8. A method of fabricating a thin Hall-bar read-head sensor as set forth in claim 1, where said Hall-bar material is mercury cadmium telluride.

9. A method of fabricating a thin Hall-bar read-head sensor as set forth in claim 8, where said substrate is conducting InSb, said two outer strips and said top conducting layer are Au.

10. A method of fabricating a thin Hall-bar read-head sensor as set forth in claim 4, where said Hall-bar material is insulating CdTe.

11. A method of fabricating a thin Hall-bar read-head sensor as set forth in claim 10, where said two outer strips are CdTe, and said second insulating material is MgTe.

12. A method of fabricating a thin Hall-bar read-head sensor as set forth in claim 11, where said fabricating a top conducting layer is done by diffusion of a vapor into exposed edges of said materials and the diffusant atom is Hg.

13. A method of fabricating a thin Hall-bar read-head sensor as set forth in claim 4, where said Hall-bar material comprises cadium telluride.

14. A method of fabricating a thin Hall-bar read-head sensor as set forth in claim 13, where said two outer strips are InAs.

15. A method of fabricating a thin Hall-bar read-head sensor as set forth in claim 1, where the material of each of said three strips is selected for optimal lattice match with said Hall-bar material layer.

16. A method of fabricating a thin Hall-bar read-head sensor as set forth in claim 1, where said fabricating a top conducting layer is performed by diffusion of a vapor into exposed edges of said materials.

17. A method of fabricating a thin Hall-bar read-head sensor as set forth in claim 1, where said fabricating a top conductor layer is performed by forming a 2-dimensional electron gas.

* * * * *